United States Patent [19]
Knauer

[11] Patent Number: 5,479,107
[45] Date of Patent: Dec. 26, 1995

[54] ASYNCHRONOUS LOGIC CIRCUIT FOR 2-PHASE OPERATION

[75] Inventor: Karl Knauer, Grafing, Germany

[73] Assignee: Siemens Aktiengesellschaft, Munich, Germany

[21] Appl. No.: 331,576

[22] PCT Filed: Apr. 30, 1993

[86] PCT No.: PCT/DE93/00380

§ 371 Date: Nov. 2, 1994

§ 102(e) Date: Nov. 2, 1994

[87] PCT Pub. No.: WO93/22838

PCT Pub. Date: Nov. 11, 1993

[30] Foreign Application Priority Data

May 6, 1992 [DE] Germany ............ 42 14 981.9

[51] Int. Cl.⁶ ............ H03K 19/01; H03K 19/0948
[52] U.S. Cl. ............ 326/17; 326/98; 326/121; 326/119
[58] Field of Search ............ 326/112, 119, 326/121, 17, 21, 95, 98

[56] References Cited

U.S. PATENT DOCUMENTS

| | | | |
|---|---|---|---|
| 5,117,133 | 5/1992 | Luebs | 326/83 |
| 5,371,424 | 12/1994 | Quigley et al. | 326/121 |
| 5,382,844 | 1/1995 | Knauer | 326/95 |

FOREIGN PATENT DOCUMENTS

| | | |
|---|---|---|
| 0147598 | 10/1985 | European Pat. Off. . |
| 4115081 | 12/1992 | European Pat. Off. . |
| WO92/20156 | 12/1992 | WIPO . |

OTHER PUBLICATIONS

Electronics Letters, vol. 25, No. 3, "Evaluation of Self–Timed Systems for VLSI", Patel et al, 2 Feb. 1989, pp. 215–217.

Electronics Letters, vol. 23, No. 6, "Self: A Self–Timed Systems Design Technique", Stevenage, 12 Mar. 1987, pp. 269–270.

Primary Examiner—Edward P. Westin
Assistant Examiner—Jon Santamauro
Attorney, Agent, or Firm—Hill, Steadman & Simpson

[57] ABSTRACT

An asynchronous logic circuit has a plurality of input lines (I) connected both to an n-channel logic block (NL) and to a p-channel logic block (PL) which is inverse with respect thereto (split transistor switch logic), in which, both in response to a rising and to a falling edge of a request signal at a request input (REQ), valid output data can be produced at outputs (OUT1, OUT2) of the asynchronous logic circuit in each case before a signal change at a ready-message output (RDY). Advantages are in particular the low outlay on circuitry and the doubling of the throughput in comparison with a corresponding status-controlled asynchronous logic circuit.

3 Claims, 2 Drawing Sheets

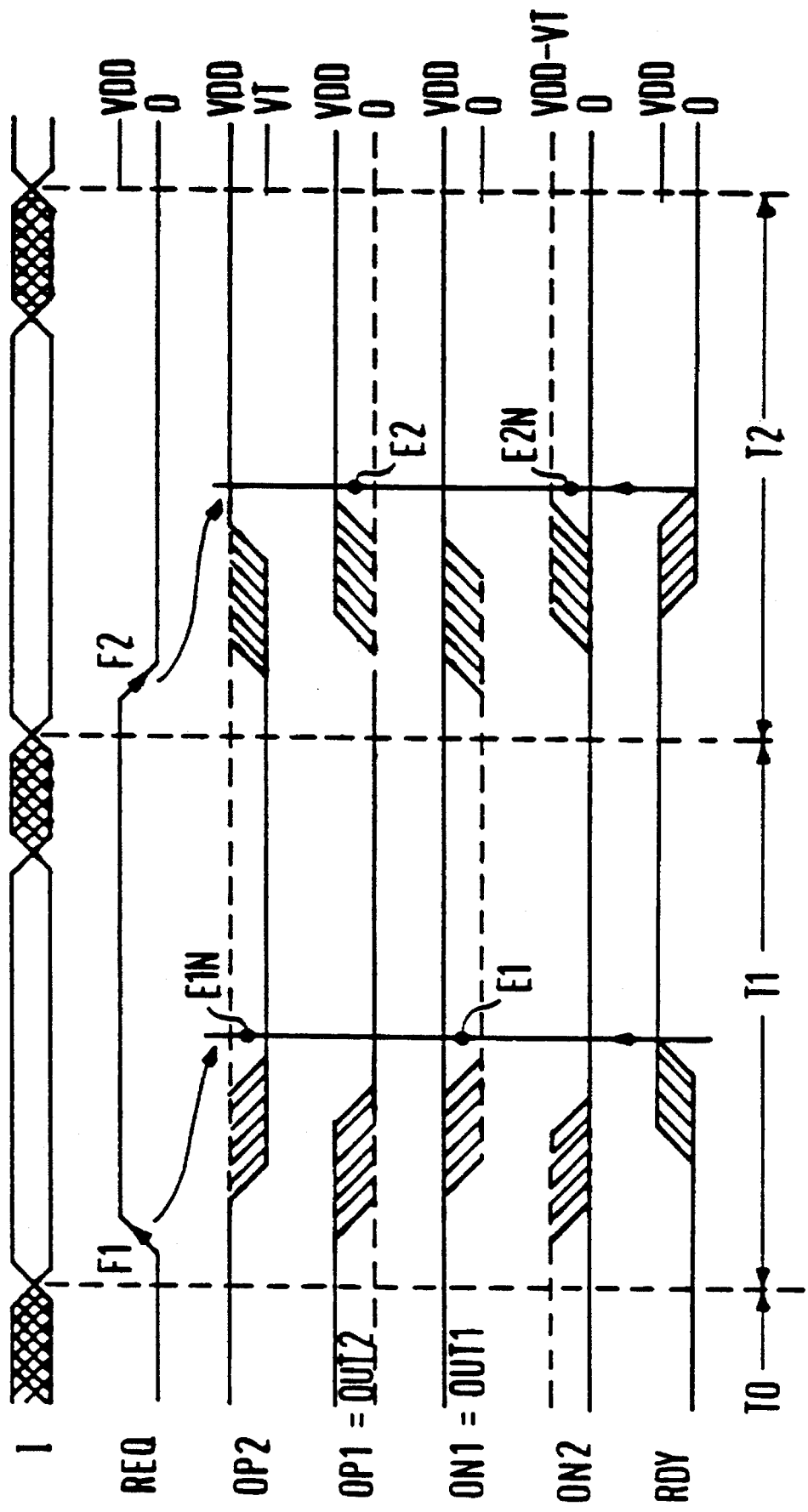

ASYNCHRONOUS LOGIC CIRCUIT FOR 2-PHASE OPERATION

BACKGROUND OF THE INVENTION

The invention relates to an asynchronous logic circuit.

A logic circuit of the generic type is presented, for example, in the Patent Application submitted to the German Patent Office with the official designation P 41 15 081.3 corresponding to U.S. Ser. No. 08/146,061 and constitutes a prior art in terms of PatG §3 (2)/EPC Art. 54 (3). This is a logic circuit in which a plurality of input lines is connected both to a logic block made of n-channel field-effect transistors and to a logic block which is inverse with respect thereto and consists of p-channel transistors (split transistor switch logic), in which both blocks are connected both to a precharging transistor and a charging transistor in each case and in which the transistors which are connected to the first block can be driven directly and the transistors which are connected to the other logic block can be driven indirectly via an inverter by means of an request signal, precharging taking place in a first state (low) of the request signal and charging or evaluation taking place in the second state (high) in accordance with the logic connection prescribed by the logic blocks.

The European Patent Application with the Publication Number 0 147 598 discloses a clocked differential cascade voltage switching logic system (CVS logic system) in which a first switching device and a second switching device are provided whose first outputs are connected in each case via transistors to the supply voltage and whose second outputs are connected in each case via transistors to reference potential, the second switching device being supplied with input signals which are complementary to the input signals of the first switching device and the second switching device switching through precisely when the first switching device does not switch through, and vice versa.

SUMMARY OF THE INVENTION

The invention is based on the object of disclosing an asynchronous logic circuit which can be operated in 2-phase mode (signal edge-controlled) and not as is otherwise customary in 4-phase mode (status-controlled) and which requires the smallest possible degree of outlay in terms of circuitry.

This object is achieved according to the invention by an asynchronous logic circuit having first and second logic blocks. A first output of the first logic block is connected via a first field-effect transistor of a first conduction type to a supply voltage terminal and a second output of the first logic block is connected via a first field-effect transistor of a second conduction type to a reference potential terminal.

A first output of the second logic block is connected via a first field-effect transistor of a first conduction type to a supply voltage terminal and a second output of the second logic block is connected via a first field-effect transistor of a second conduction type to a reference potential terminal.

The first logic block contains only field-effect transistors of the first conduction type and the second logic block contains only field-effect transistors of the second conduction type. Both logic blocks are connected to the same input lines.

The first and second logic blocks have switching behaviors which are complementary to one another. The first output of the first logic block is switched through, as a function of control signals of the input lines, to the second output of the first logic block precisely when the first output of the second logic block is not switched through to the second output of the second logic block, and vice versa.

The respective gate of the first field-effect transistor of the first conduction type, of the first field-effect transistor of the second conduction type, of the second field-effect transistor of the first conduction type and of the second field-effect transistor of the second conduction type is connected to a request input.

A ready-message output is connected via third and fourth field-effect transistors of the first conduction type to the supply voltage terminal. The gate of the third field-effect transistor of the first conduction type is connected to the first output of the second logic block and the gate of the fourth field-effect transistor of the first conduction type is connected to the first output of the first logic block.

The ready-message output is connected via third and fourth field-effect transistors of the second conduction type to the reference potential terminal. The gate of the third field-effect transistor of the second conduction type is connected to the second output of the first logic block and the gate of the fourth field-effect transistor of the second conduction type is connected to the second output of the second logic block. Outputs of the two logic blocks simultaneously constitute outputs of the asynchronous logic circuit.

In at preferred embodiments of the logic circuit according to the invention either, the first logic block is exclusively composed of n-channel field-effect transistors and the second logic block is exclusively composed of p-channel field-effect transistors, or vice versa.

The advantage which can be achieved with the invention lies in particular in the fact that with this edge-controlled asynchronous logic circuit it is possible to double the throughput in comparison with a known status-controlled logic circuit.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 3 shows a time diagram or explaining the mode of operation of the asynchronous logic circuit according to the invention in accordance with FIG. 2.

DESCRIPTION OF THE PREFERRED EMBODIMENT

Asynchronous or "self timed" circuits are regarded as a future-oriented circuitry principle for the sub μm range since with the currently customary global clock actuation in future highly complex and extremely high speed circuits clock skews occur in the clock supply which restrict the dimensions of a corresponding system and/or lead to reduced processing speed. In asynchronous circuits which communicate with one another according to a "handshake" method, these problems arising from a central clock are prevented.

The basis required for such asynchronous circuits are asynchronous logic circuits which execute a logic connection as quickly as possible in response to a request signal and make available, together with valid data, a ready-message signal at the output of the logic circuit as far as possible in regular and inverted form.

Figure 1:
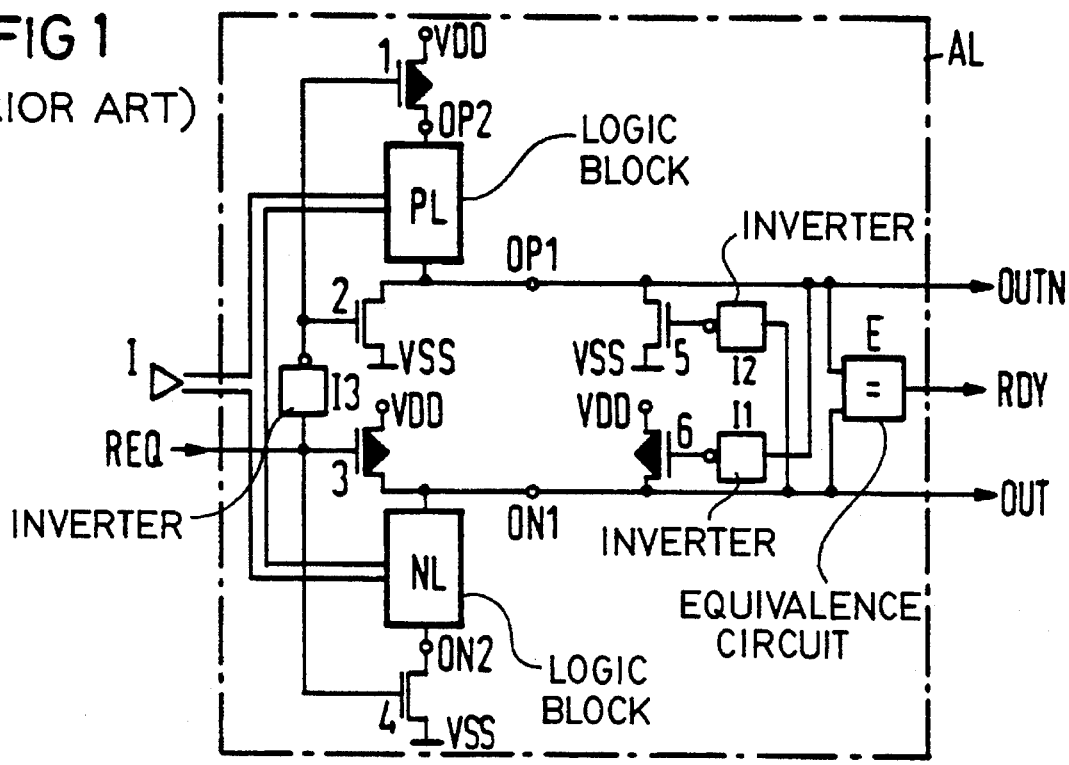
FIG. 1 shows an asynchronous logic circuit which is already known.

In FIG. 1, a known asynchronous logic circuit AL for 4-phase operation (status-controlled) is shown, in which a first logic block NL consists of n-channel transistors and a second logic block PL consists of p-channel transistors and the second logic block has a logic which is inverse with respect to the first logic block (split transistor switch logic). Both the first logic block and the second logic block are connected to a plurality of inputs I of the logic circuit. The first logic block NL is connected at one output ON1 via a p-channel precharging transistor 3 to the supply voltage VDD and at one output ON2 via a n-channel charging transistor 4 to reference potential VSS. Correspondingly, the second logic block PL is connected at an output OP1 via an n-channel precharging transistor 2 to reference potential VSS and at an output OP2 via a p-channel charging transistor 1 to the supply voltage VDD. A request input REQ of the logic circuit is directly connected to one gate of the precharging transistor 3 and one gate of the charging transistor 4 as well as indirectly via an inverter I3 to one gate of the precharging transistor 2 and to the gate of the charging transistor 1. The output ON1 forms an output OUT in the asynchronous logic circuit AL and the output OP1 constitutes the output OUTN, inverted with respect thereto, of the logic circuit AL. In the asynchronous logic circuit AL there is a further n-channel precharging transistor 5 which can be driven via an inverter I2, a further p-channel precharging transistor 6 which can be driven via an inverter I1, and an equivalence gate E whose inputs are connected directly to the outputs OP1 and ON1 of the logic circuit AL. The other precharging transistor 5 is connected parallel to the precharging transistor 2 and the other precharging transistor 6 is connected parallel to the precharging transistor 3. The input of the inverter I1 is connected to the output OP1 and the input of the inverter I2 is connected to the output ON1, as a result of which mutual coupling of the outputs OP1 and ON1 is brought about. The output of the equivalence circuit E simultaneously constitutes a ready-message output RDY of the asynchronous logic circuit AL.

Figure 2:
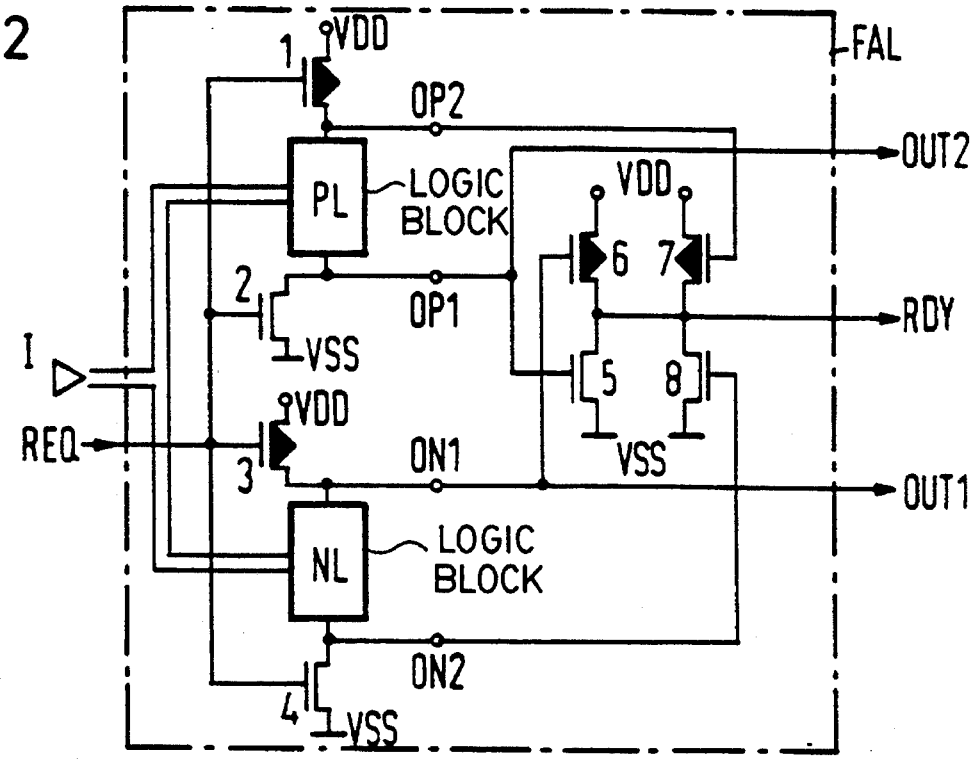
FIG. 2 shows an asynchronous logic circuit according to the invention.

In FIG. 2, an asynchronous logic circuit FAL according to the invention for 2-phase operation (edge-controlled) with two outputs OUT1 and OUT2 is illustrated, the logic circuit FAL according to the invention being constructed in a similar way to the known logic circuit AL shown in FIG. 1, and mutually corresponding switching elements being given identical designations in both figures. A first difference in the construction of the asynchronous logic circuit FAL according to the invention in comparison with the known asynchronous logic circuit AL is that it is possible to drive the transistors 1 and 2 not via the inverter I3 but rather directly by means of the signal of the request input REQ. A further difference between the two asynchronous logic circuits AL and FAL is that the logic circuit FAL according to the invention does not have any inverters I1 and I2 and has no equivalence circuit E but rather one more p-channel transistor 7 and one more n-channel transistor 8 are provided, first terminals of the transistors 5 and 8 being connected to reference potential and second terminals of these transistors being connected to the ready-message output RDY and first terminals of the transistors 6 and 7 being connected to the ready-message output RDY and second terminals of these transistors 6 and 7 being connected to the supply voltage VDD, and the output OP1 which simultaneously forms the output OUT2 of the logic circuit FAL according to the invention being connected directly to the gate of the transistor 5, the output ON1 which simultaneously forms the output OUT1 of the asynchronous logic circuit according to the invention being connected directly to the gate of the transistor 6, the output OP2 being connected directly to the gate of the transistor 7 and the output ON2 being connected directly to the gate of the transistor 8.

In FIG. 3, for this purpose the signals of the plurality of inputs I, the signals at the request input REQ, the signals at the outputs OP2, OP1, ON1 and ON2 of the logic blocks and the signal of the ready-message output RDV of the logic circuit FAL according to the invention are illustrated in directly successive time ranges T0 . . . T2. A respective time range begins here with the presence of valid input data at the inputs I and ends with the presence of new valid input data. Within the intermediate time range T0, the request input REQ is for example, as shown here, at reference potential VSS, as a result of which the transistors I and 3 are conductive, the transistors 2 and 4 are blocked and the outputs OP2 and ON1 are consequently precharged to the supply voltage VDD and the ready-message output RDY is disconnected from VDD. If, for example, the logic block PL is conductive in this case, the output OP1 or the output OUT2 of the logic circuit FAL according to the invention is at the supply voltage VDD; but if it is blocked, reference potential is present at the output OP1 or at the output OUT2 of the logic circuit FAL. Since the logic block NL has a logic which is inverse with respect to the logic block PL, the logic block NL blocks as soon as the logic block PL is conductive and reference potential is present at the output ON2 when the output OP1 conducts VDD, and a voltage VDD–VT which is indicated by broken lines is present at the output ON2 when the node OP1, indicated by broken lines, conducts reference potential VSS. The voltage VDD–VT is the supply voltage VDD reduced by the operating voltage VT which is produced as a result of the series circuit of the p-channel transistor 3 with the n-channel transistors of the logic block NL. If a rising edge F1 occurs within the time range T1 at the signal of the request input REQ, the transistors 1 and 3 become blocked, the transistors 2 and 4 become conductive, the output OP1 or the output OUT2 of the logic circuit according to the invention and the output ON2 become discharged to reference potential VSS somewhat delayed with respect to F1. If for example after processing of the input data present at the inputs I the logic block PL becomes conductive, a transition from the supply voltage VDD to the operating voltage VT takes place at the output OP2, and at the output ON1 of the logic circuit according to the invention or at the output OUT1, which of course is blocked due to the inverse logic, the supply voltage VDD is maintained in this case. In the other case, represented by broken lines, in which the logic block PL remains blocked after processing of the input data present at the inputs and the logic block NL becomes conductive, the supply voltage VD is maintained at the output OP2, and the output ON1 or the output OUT1 of the logic circuit according to the invention receives reference potential VSS. Since either the logic block PL or the logic block NL which is inverse with respect thereto becomes conductive, either the transistor 6 or the transistor 7 becomes conductive, as a result of which the ready-message output RDY receives the supply voltage VDD and thus a valid processing result E1 which is triggered by F1 and is present at the output OUT1 is signalled. If then a falling edge F2 occurs within the time range T2 at the signal of the request input REQ, the transistors 1 and 3 become conductive again, the transistors 2 and 4 block again, the outputs OP2 and ON1 or the output OUT1 of the logic circuit according to the invention are consequently precharged to the supply voltage VDD somewhat delayed with respect to F2. If, for example, after a further processing of other input data present at the inputs I the logic block PL becomes conductive, a transition from reference potential to VDD takes place at the output OP1 or at the output OUT2 of the logic circuit according to the invention and the reference potential is maintained at the node ON2 which is blocked because of the inverse logic. In the other case, indicated by broken lines, in which the logic block PL remains blocked and the logic block NL becomes conductive, the reference potential VSS is maintained at the output OP1 or at the output OUT2 of the logic circuit according to the invention and the output ON2 receives the supply voltage VDD–VT reduced by the operating voltage. Since, again, either the logic block PL or the logic block NL which is inverse with respect thereto becomes conductive, either the transistor 5 or the transistor 8 becomes conductive, as a result of which the ready-message output RDY receives reference potential VSS and thus another valid processing result E2 which is triggered by the edge F2 and is present at the output OUT2 of the logic circuit according to the invention is signalled.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An asynchronous logic circuit, comprising:

a request input and a ready-message output;

a first logic block having first and second outputs and an input;

a second logic block having first and second outputs and an input;

the first output of the first logic block connected via a first field-effect transistor of a first conduction type to a supply voltage terminal and the second output of the first logic block connected via a first field-effect transistor of a second conduction type to a reference potential terminal;

the first output of the second logic block connected via a second field-effect transistor of a first conduction type to the supply voltage terminal and the second output of the second logic block connected via a second field-effect transistor of a second conduction type to the reference potential terminal;

the first logic block having only field-effect transistors of the first conduction type and the second logic block having only field-effect transistors of the second conduction type and both logic blocks being connected to common input lines;

the first and second logic blocks having switching behaviors which are complementary to one another, the first output of the first logic block being switched through, as a function of control signals on the input lines, to the second output of the first logic block precisely when the first output of the second logic block is not switched through to the second output of the second logic block, and vice versa;

a respective gate of the first field-effect transistor of the first conduction type, of the first field-effect transistor of the second conduction type, of the second field-effect transistor of the first conduction type and of the second field-effect transistor of the second conduction type being connected to the request input, the ready-message output connected via a third field-effect transistor of the first conduction type and a fourth field-effect transistor of the first conduction type to the supply voltage terminal, a gate of the third field-effect transistor of the first conduction type being connected to the first output of the second logic block and a gate of the fourth field-effect transistor of the first conduction type being connected to the first output of the first logic block;

the ready-message output connected via a third field-effect transistor of the second conduction type and a fourth field-effect transistor of the second conduction type to the reference potential terminal, a gate of the third field-effect transistor of the second conduction type being connected to the second output of the first logic block and a gate of the fourth field-effect transistor of the second conduction type being connected to the second output of the second logic block; and the first output of the second logic block being a first output of the asynchronous logic circuit and the second output of the first logic block being a second output of the asynchronous logic circuit.

2. The logic circuit as claimed in claim 1, wherein the field-effect transistors of the first logic block are all n-channel field-effect transistors and the field-effect transistors of the second logic block are all p-channel field-effect transistors.

3. The logic circuit as claimed in claim 1, wherein the field-effect transistors of the first logic block are all p-channel field-effect transistors and the field-effect transistors of the second logic block are all n-channel field-effect transistors.

\* \* \* \* \*